United States Patent
OuYang et al.

(10) Patent No.: US 6,288,959 B1
(45) Date of Patent: Sep. 11, 2001

(54) CONTROLLING THE PRECHARGE OPERATION IN A DRAM ARRAY IN A SRAM INTERFACE

(75) Inventors: Paul H. OuYang; Donald Liusie, both of San Jose, CA (US)

(73) Assignee: DMEL Incorporated, Santa Clara, CA (US)

( * ) Notice: Subject to any disclaimer, the term of this patent is extended or adjusted under 35 U.S.C. 154(b) by 0 days.

(21) Appl. No.: 09/632,232

(22) Filed: Aug. 4, 2000

(51) Int. Cl.⁷ .................................................. G11C 7/00
(52) U.S. Cl. .................... 365/203; 365/210; 365/189.05; 365/189.07; 365/233
(58) Field of Search .................................... 365/203, 210, 365/189.05, 189.07, 230.08, 233

(56) References Cited

U.S. PATENT DOCUMENTS

| | | | |
|---|---|---|---|
| 5,745,421 | * 4/1998 | Pham et al. | 365/203 |
| 5,813,038 | 9/1998 | Thome et al. | 711/154 |
| 5,861,767 | 1/1999 | Patel et al. | 327/126 |
| 5,881,016 | 3/1999 | Kenkare et al. | 365/230.03 |
| 5,912,853 | 6/1999 | Rao | 365/205 |
| 5,920,885 | 7/1999 | Rao | 711/105 |
| 5,982,696 | 11/1999 | Rao | 365/230.03 |
| 6,038,176 | 3/2000 | Shyu | 365/189.01 |
| 6,052,134 | 4/2000 | Foster | 345/521 |

* cited by examiner

*Primary Examiner*—David Nelms
*Assistant Examiner*—David Lam
(74) *Attorney, Agent, or Firm*—Skjerven Morrill MacPherson LLP; Alan H. MacPherson; Michael J. Halbert

(57) ABSTRACT

The precharge operation of a DRAM array in a non-multiplexed address interface is controlled so that the DRAM is precharged only if there is a change in the word line address. By precharging the DRAM only when a new word line is asserted, a significant power savings may be obtained. An activity monitor compares each new word line address with the previous word line address. If the activity monitor indicates that a new word line is asserted, a timing control circuit will precharge the DRAM, including equalizing the bit lines. If the activity monitor indicates that the word line is not changed, the timing control circuit does not precharge the DRAM. The timing control circuit includes a dummy precharge circuit and initiates a dummy precharge cycle in the beginning of each new cycle for timing purposes. The timing control circuit initiates the active cycle after the dummy precharge cycle regardless of whether a new word line is asserted or not.

17 Claims, 9 Drawing Sheets

CONTROLLING THE PRECHARGE OPERATION IN A DRAM ARRAY IN A SRAM INTERFACE

FIELD OF THE INVENTION

The present invention relates to power management in a memory system that, e.g., includes a dynamic random access memory (DRAM) array in a static random access memory (SRAM) interface. In particular, the present invention relates to reducing power consumption in a memory system by controlling the precharge cycle.

BACKGROUND

Power consumption and form factors in portable systems, such as mobile phones, third-generation (3-G) wireless systems, and personal digital assistants (PDA), are a significant concern, particularly due to the desire to increase battery life and reduce size. Memory devices within portable systems are a significant part of the total power consumption. Typically, SRAM arrays are more power efficient than DRAM arrays and, thus, are conventionally used in portable systems. DRAM arrays, however, are typically more dense than SRAM arrays and thus DRAM arrays have a smaller form factor. The memory size used in portable systems is growing, i.e., currently the typical memory size is 4 Mbit but will soon be 8 Mbit. Thus, the increased density of DRAM arrays will be desirable for use in mobile communication systems.

One type of memory device that has been discussed as a possible replacement of SRAMs for portable systems is known as "pseudo SRAM." Pseudo SRAM uses a non-multiplexed SRAM type interface with a DRAM core. Advantageously, the SRAM type interface requires less power than a conventional multiplexed address DRAM interface. Thus, pseudo SRAM provides a small form factor because of the DRAM core and yet provides some power savings because of the SRAM interface. Unfortunately, a major drawback to pseudo SRAM is that the DRAM core consumes more power than an SRAM core. Thus, it is desirable to reduce the power consumption of a DRAM core in pseudo SRAM.

SUMMARY

A memory system with a DRAM array in a non-multiplexed address, SRAM type, interface is precharged only when a new word line is asserted, in accordance with the present invention. When the word line is not changed, the DRAM is not precharged, thereby reducing power consumption. The precharge cycle occurs prior to the active cycle so that the memory system can determine whether the precharge operation is necessary. In addition, a dummy precharge circuit is used to simulate a precharge cycle for timing purposes. Thus, the active cycle is performed at the end of the simulated precharge cycle so that the timing of the active cycle will be consistent from one cycle to the next regardless of whether the DRAM is precharged. When the DRAM is precharged, the actual precharge operation has the same timing as the simulated precharge cycle.

Thus, one embodiment of the present invention includes a method of operating a DRAM array having a plurality of memory cells arranged in rows with associated x-addresses and columns with associated y-addresses, that includes receiving a first address containing at least an x-address and a y-address and receiving a second address containing at least a new x-address and a new y-address and determining if the new x-address is different than the x-address in the first address. The method includes precharging the DRAM array if the new x-address is different than the x-address in the first address and not precharging the DRAM array if the new x-address is not different than the x-address in said first address. The precharge cycle precedes the active cycle, and thus, the DRAM is accessed according to the second address after precharging said DRAM array. In addition, a dummy precharge timing cycle is generated for timing purposes.

The method of operation of the memory system includes receiving a new address for the DRAM array, performing a precharge cycle to precharge the DRAM array when the new address includes a new word line, and performing an active cycle to access the DRAM array after the precharge cycle.

The memory system of the present invention includes a control circuit for controlling the operation of a DRAM array. The control circuit, e.g., includes an activity monitor circuit and a timing control circuit. The control circuit receives an x-address associated with the word line for a new operation cycle, and includes a comparison circuit that determines if the x-address is different from a preceding x-address for a preceding operation cycle. The control circuit also includes a timing generator coupled to the comparison circuit and that outputs the precharge signals, including an equalization enable signal and a sense latch disable signal, when the x-address is different from the preceding x-address and outputs an equalization disable signal and a sense latch enable signal when the x-address is the same as the preceding x-address.

With the use of the control circuitry including the timing control circuit that activates the precharge circuitry only when there is a new word line address, a significant power savings may be obtained. In addition, the control circuitry may receive the new bit line address, which is compared to the preceding bit line address. If a different bit line address is being asserted, the control circuitry will enable a sense latch circuit for the bit lines. If, however, the bit line address is the same as the preceding address, the sense latch circuit may be disabled, thereby further reducing power consumption.

DETAILED DESCRIPTION

In accordance with an embodiment of the present invention, a memory system, which includes a DRAM array within an SRAM interface, controls the active cycle and precharge cycle based on monitored address activity. Advantageously, the memory is precharged only if a new word line address is fetched, which results in substantial power savings. The precharge cycle is performed prior to the active cycle so that a decision to precharge or not may be made based on the new address information. In addition, the memory system includes a dummy precharge circuit that generates a dummy precharge cycle that is used for timing purposes, for example, when the memory array is not actually precharged.

Figure 1:
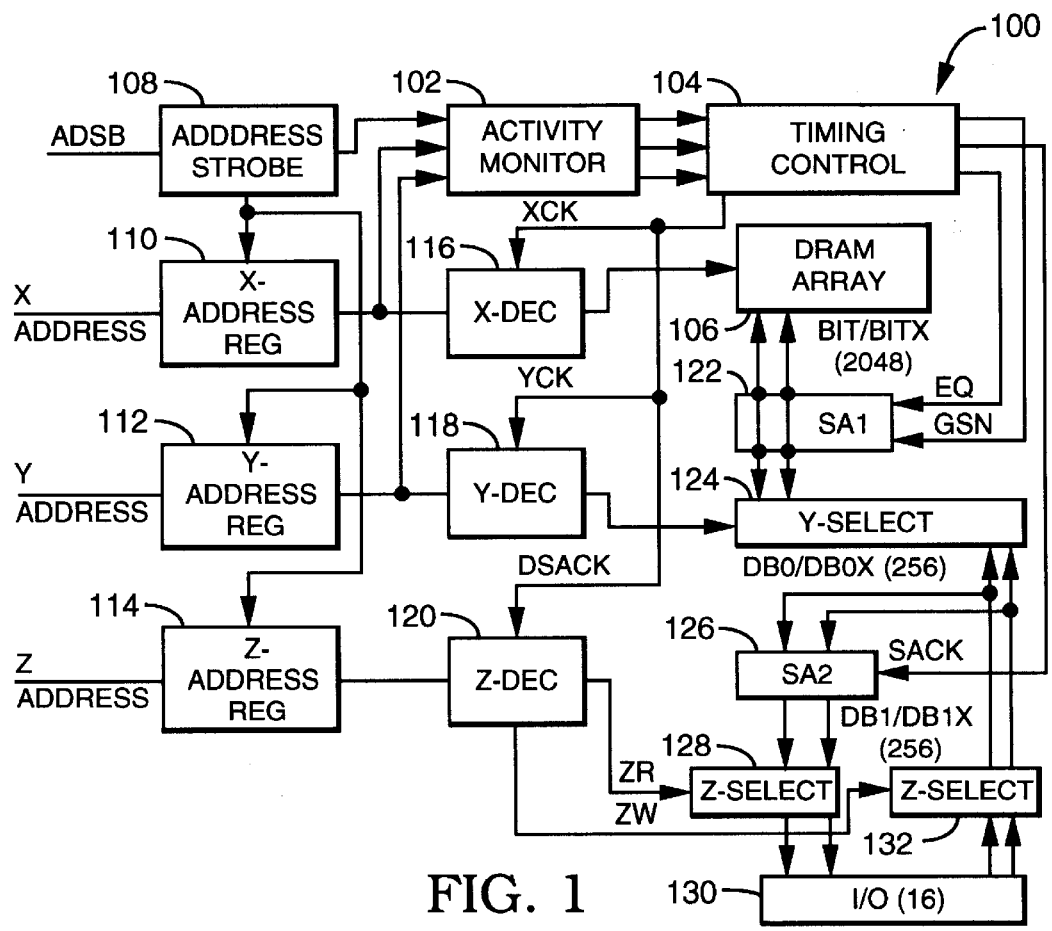
FIG. 1 is a block diagram of a memory system in accordance with an embodiment of the present invention.

FIG. 1 is a block diagram of a memory system 100 in accordance with an embodiment of the present invention. Memory system 100 is similar to memory systems that use DRAM cores in an SRAM interface, however, an activity monitor circuit 102 and timing control circuit 104 are included, which control the active and precharge cycles in accordance with the present invention. The activity monitor circuit 102 and timing control circuit 104, thus, make up a control circuit that controls the operation of the memory system 100.

As shown in FIG. 1, memory system 100 includes a DRAM array 106 that is, e.g., a conventional 8 Mbit DRAM organized with 4 k word lines×2 k column pairs. Of course, DRAM array 106 may have any desired size. DRAM array 106 is coupled to an SRAM type non-multiplexed address input interface.

The interface with the DRAM array 106 includes an address strobe circuit 108 that receives an address strobe bar signal (ADSB) when the memory system 100 operates in synchronous mode. The address strobe circuit 108 provides a clock signal to a word line address (sometimes referred to herein as the "x-address") register 110, a bit line (sometimes referred to herein as the "y-address") register 112, and a I/O select (sometimes referred to herein as the "z-address") register 114. The x-address register 110 receives, for example, a 12-bit x-address and is coupled to the 4096 word-line x-decoder 116. The y-address register 112 receives a 3-bit y-address and is coupled y-decoder 118, while z-address register 114 receives a 4-bit z-address and is coupled to the z-decoder 120. The 4 k word lines of DRAM array 106 are conventionally connected to the x-decoder 116, while the 2 k column pairs in DRAM array 106 are conventionally connected to a 2 k sense amplifier 122 and through an 8:1 multiplexer y-select circuit 124, which produces 256 data out bit DB0/DB0x pairs. The 256 DBO/DB0x pairs are received by a second level sense amplifier 126 that is used during read operations. The 256 data outputs of the second level sense amplifier DB1 and DB1x are received by 16 I/O circuits 130 through a 16:1 multiplexer z-select 128 controlled by the z-decoder 120 with a read control signal (ZR).

During write operations, the 16 I/O circuits 130, which receive the data to be written into the memory array, are coupled to a de-multiplexer z-select 132 that is connected to the y-select circuit 124, as shown in FIG. 1. The z-select 132 is controlled by the z-decoder 120 with a write control signal (ZW). It should be understood, of course, that the read z-select 128 and the write z-select 132 may be part of the same circuit, but are shown separated by function in FIG. 1 for the sake of clarity.

Figure 2:
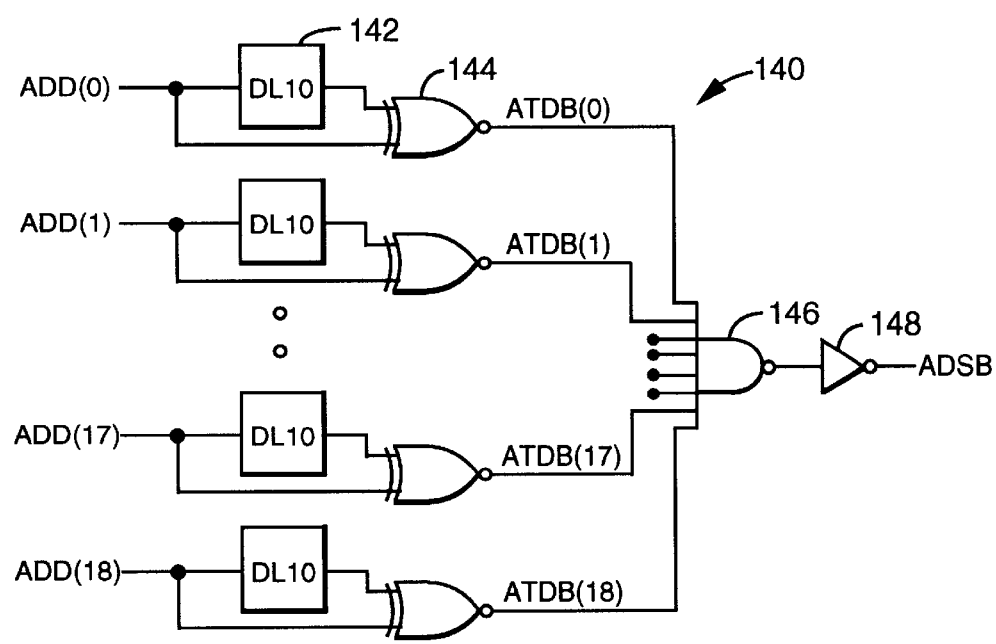
FIG. 2 is a schematic diagram of an address transition detection circuit that may be used with memory system when operating in asynchronous mode.

FIG. 2 shows a schematic diagram of an address transition detection circuit 140 that may be used in place of address strobe circuit 108 when memory system 100 operates in asynchronous mode. As shown in FIG. 2, the address transition detection circuit 140 determines when a change of address has occurred and accordingly produces an address strobe bar signal (ADSB). For example, address transition detection circuit 140 includes a delay circuit 142 and exclusive NOR gate 144 for each address ADD[0] to ADD[18], which includes the x, y, and z addresses. The exclusive NOR gates 144 produce an address transition detect bit ATDB[0] to ATDB[18] indicating whether the exclusive NOR gate 144 detected a change in the address. The address transition detect bits ATDB[0] to ATDB[18] are received by a NAND gate 146, which produces the address strobe bar signal (ADSB) through an inverter 148. Thus, memory system 100 may operate synchronously with an external timing signal or asynchronously by producing an internal timing signal based on the change of any address bit. A bonding option, as is well understood by those skilled in the art, may be used to control whether memory system 100 operates synchronously or asynchronously.

The components and operation of memory system 100, except the activity monitor 102 and timing control 104, are conventional and, thus, well known by those of ordinary skill. The activity monitor 102 and timing control 104 operate together to control the active and precharge cycles in the memory system 100, in accordance with an embodiment of the present invention. It should be understood that activity monitor 102 and timing control 104 are shown as separate circuits based on their functions for the sake of simplicity, but that these circuits may be combined into a single memory array control circuit, if desired.

Activity monitor 102, as shown in FIG. 1, receives the chip select signal from address strobe 108, as well as the x-address and y-address from registers 110 and 112, respectively. Activity monitor 102 monitors the x and y addresses for activity, i.e., if a new address is being asserted. If a new x-address, i.e., word line, is asserted, activity monitor 102 signals timing control 104, which activates a precharge cycle. The precharge cycle, for example, includes disabling the last word line and equalization of the bit lines of the memory array. If a new x-address is not asserted, activity monitor 102 signals timing control 104, which does not activate the precharge cycle, thereby saving power. If a new y-address is not asserted, activity monitor 102 signals timing control 104, which disables the second sense amplifier circuit 126, as well as the y-decoder 118.

There are three modes in which the memory system 100 operates. In the first mode, there is a change in the x-address, i.e., a new word line is asserted. In the second mode, the x-address remains the same, but there is a change in the y-address, i.e., a new bit line is asserted. In the third mode, the x-address and y-address do not change, but there is a change in the z-address, i.e., a new I/O line is asserted. There is a change of z-address in every cycle. The timing control 104 produces the necessary signals to control memory system 100 based on which mode the system is operating.

Typically, with a DRAM array in an SRAM interface, a precharge cycle is automatically performed after every active cycle. In accordance with the present invention, however, the precharge cycle precedes the active cycle. Because the precharge cycle precedes the active cycle, it may be determined whether a change in the word line address has been asserted in the new cycle. The precharge cycle is then performed prior to the active cycle if a new word line is being asserted, i.e., mode 1. If the word line is not new, i.e., modes 2 or 3, the precharge cycle is not performed. Nevertheless, because timing in a memory system is crucial, particularly for synchronous operations, the active cycle needs to be delayed by the length of a precharge operation even if a precharge operation is not performed. In accordance with an embodiment of the present invention, timing control 104 simulates a precharge cycle using a dummy precharge circuit to delay the active cycle by an appropriate amount.

Figure 3A:
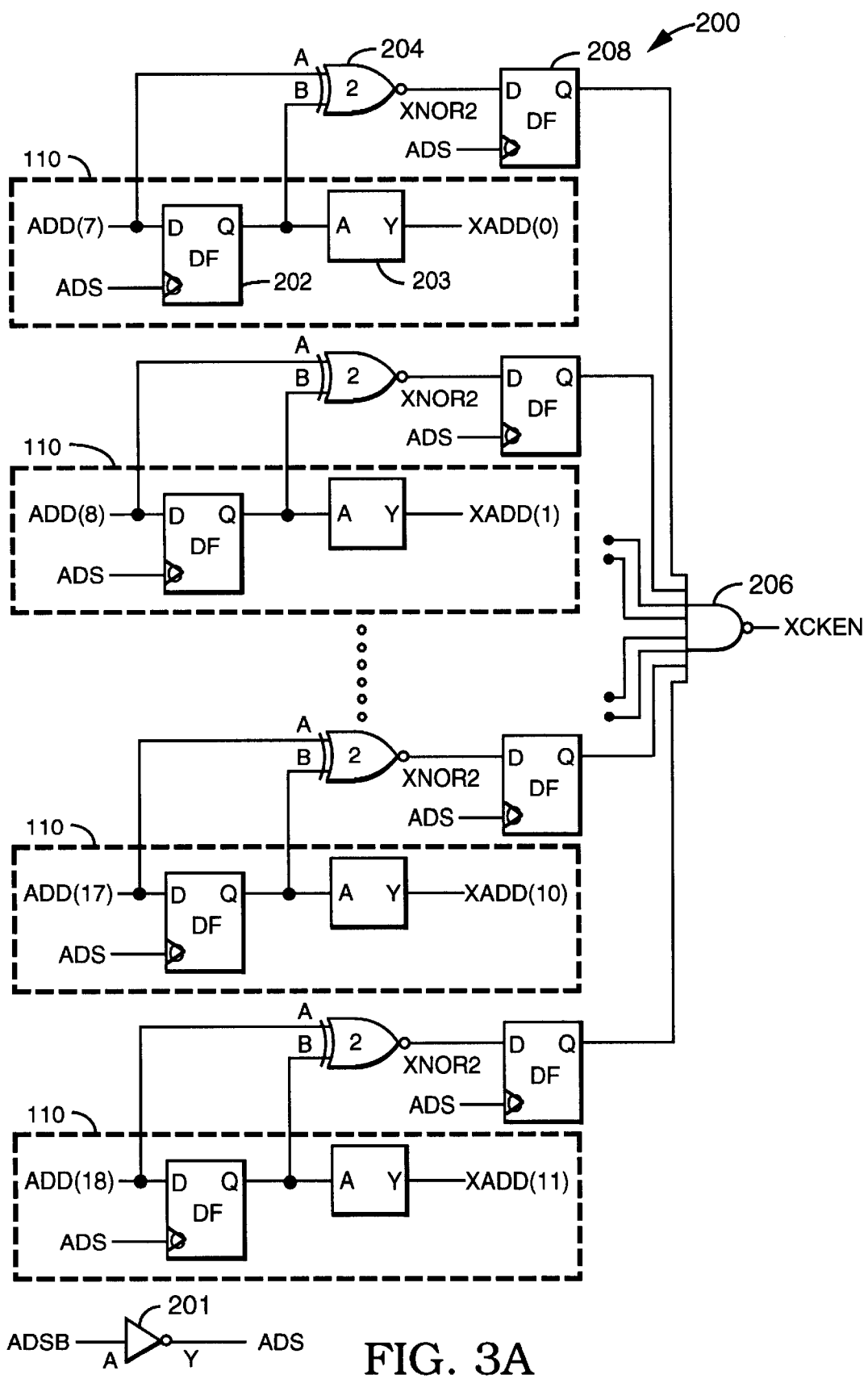
FIGS. 3A and 3B are schematic diagrams of an x-address activity monitor and a y-address activity monitor in accordance with an embodiment of the present invention.
Figure 3B:
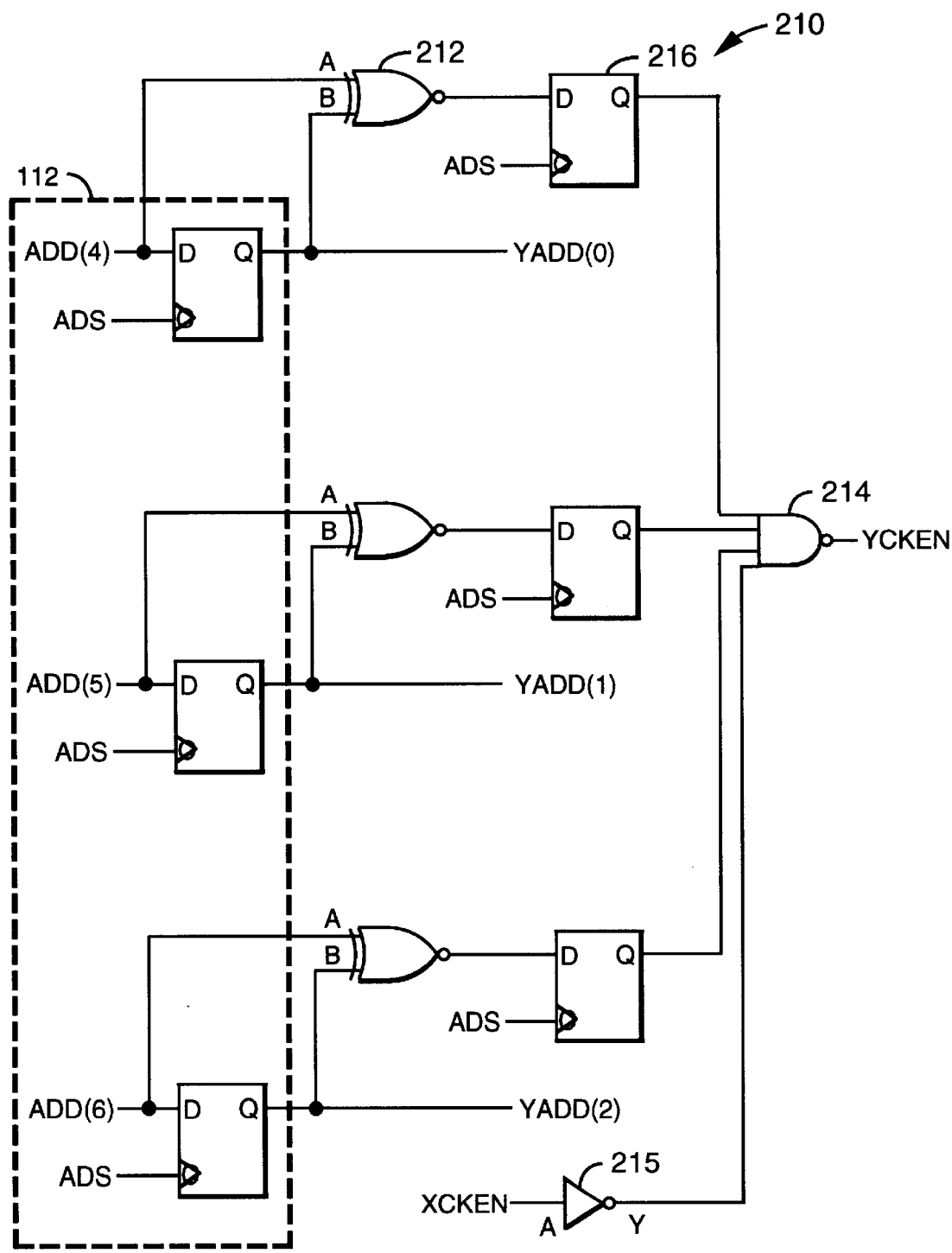

FIGS. 3A and 3B are schematic diagrams of an x-address activity monitor 200 and a y-address activity monitor 210, which are coupled to x-address register 110 and y-address register 112, respectively. The x-address activity monitor 200 and the y-address activity monitor 210 may be used as activity monitor 102 shown in FIG. 1.

For read and write operations, the external addresses are latched in registers 110, 112, and 114 and the x-address and y-address are received by the activity monitor. As shown in FIG. 3A, the x-address activity monitor 200 compares each bit in the new x-address with the corresponding bits in the old x-address to determine if any of the bits have changed, and thus functions as a comparison circuit. The operation of x-address activity monitor 200 will be described with reference to a single bit ADD(7) of the x-address for sake of clarity. As shown in FIG. 3A, bit ADD(7) of the x-address is received by latching circuit 202 and delay circuit 203 within the x-address register 110. Latching circuit 202 is controlled by an address strobe signal (ADS) which is an inverted address strobe bar signal (ADSB), as indicated by inverter 201. It should be understood that address strobe bar signal (ADSB) may be inverted in the address strobe circuit 108, activity monitor 102, timing control circuit 104, or any other appropriate location. Delay circuit 203 is used in x-address register 110 for timing purposes. An exclusive NOR gates 204 includes an input terminal that receives bit ADD(7) prior to the latching circuit 202 (i.e., the new x-address bit) and another input terminal that receives bit ADD(7) after the latching circuit 202 (i.e., the old x-address bit). A NAND gate 206, via latch 208, then receives the output of the exclusive NOR gate 204. Each bit in the x-address is handled in a similar manner as shown in FIG. 3A and, thus, there are a plurality of exclusive NOR gates and latches coupled to the NAND gate 206. The NAND gate 206 produces an x clock enable signal (XCKEN), indicating whether there is a change in the x-address. Thus, if all the old x-address bits are the same as the new x-address bits, the x clock enable signal (XCKEN) will be low and if any bit in the x-address changes, the x clock enable signal (XCKEN) will be high.

FIG. 3B shows the y-address activity monitor 210, which operates in a similar manner to the x-address activity monitor 200. Thus, as shown in FIG. 3B, an exclusive NOR gate 212 receives the new y-address bit ADD(4) at one input terminal and receives the old y-address bit ADD(4) at another input terminal. The output terminal of the exclusive NOR gate 212 is coupled to a NAND gate 214 via latch 216. Each bit in the y-address is treated in a similar manner. NAND gate 214 produces a y clock enable signal (YCKEN) indicating whether there is a change in the y-address. Thus, if all the old y-address bits are the same as the new y-address bits, the y clock enable signal (YCKEN) will be low and if any bit in the y-address changes, the y clock enable signal (YCKEN) will be high. In addition, the x clock enable signal (XCKEN) is also coupled to the NAND gate 214 via inverter 215. Thus, if there is any activity in the x-address bits, i.e., the x clock enable signal (XCKEN) is high, the y clock enable signal (YCKEN) will be high, even if all there is not a change in the y-address bits.

Figure 4A:
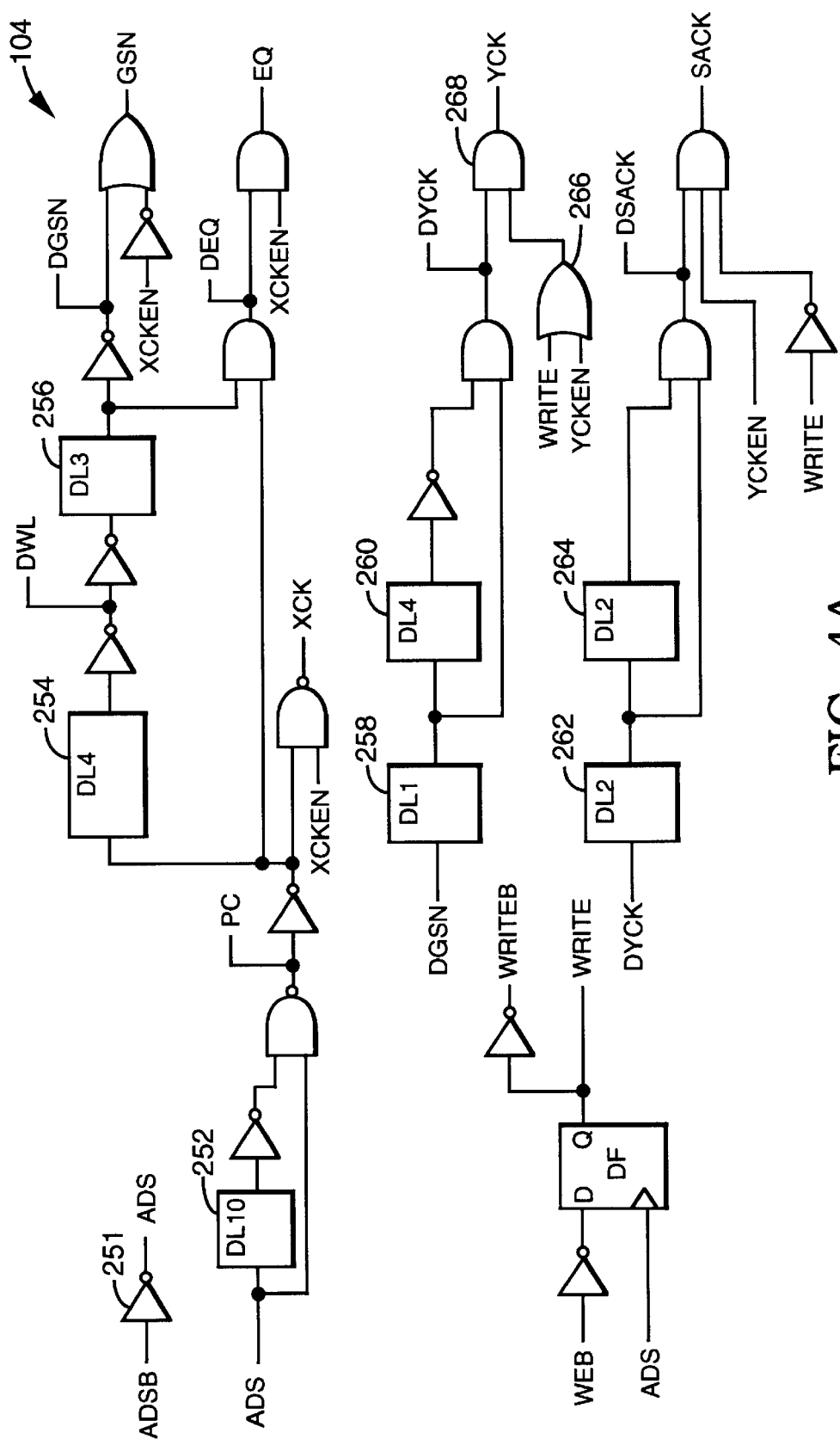
FIGS. 4A and 4B are schematic diagrams of one embodiment of a timing control circuit and a z-decoder, respectively, in accordance with an embodiment of the present invention.
Figure 4B:
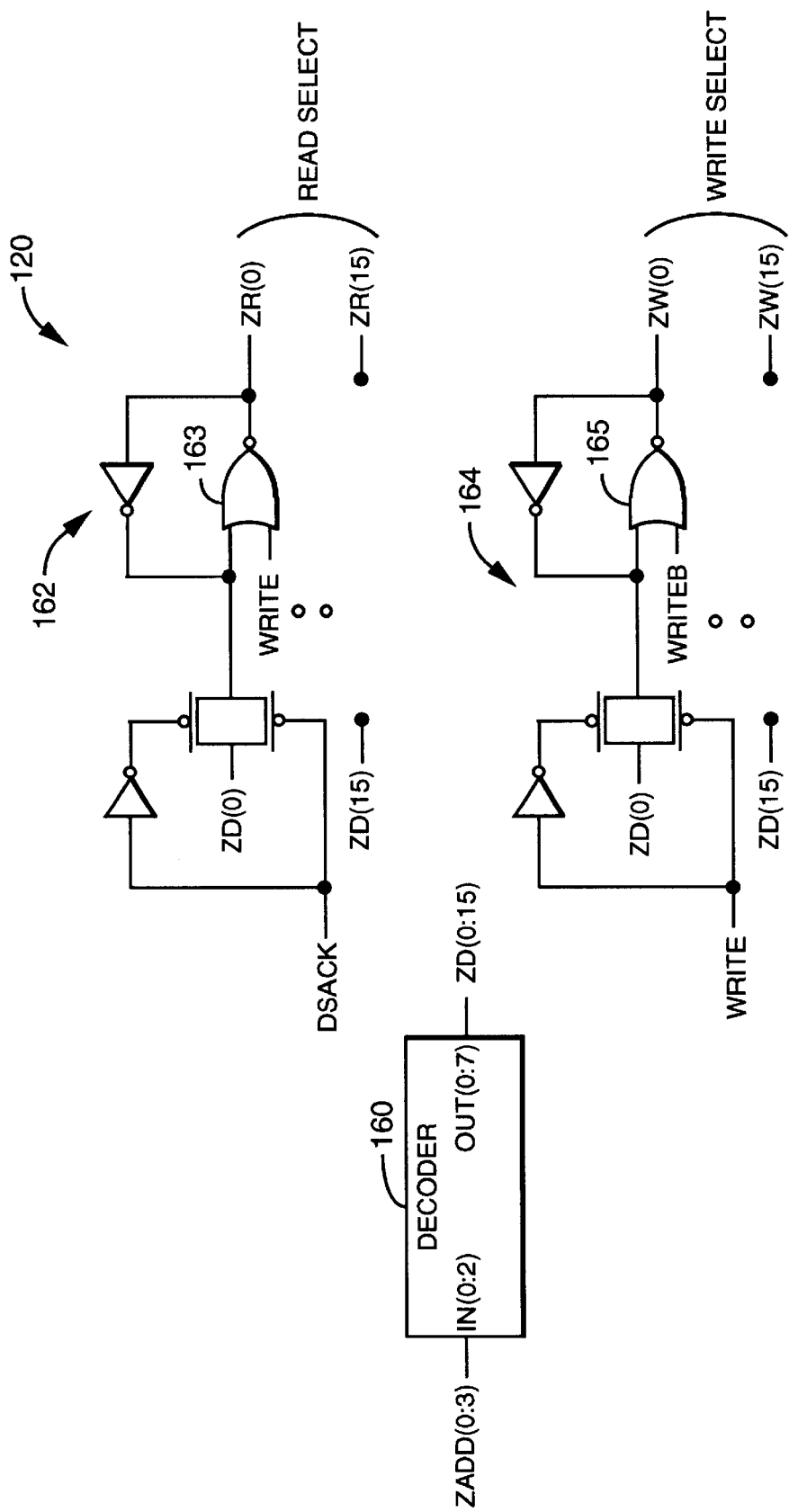
Figure 5:
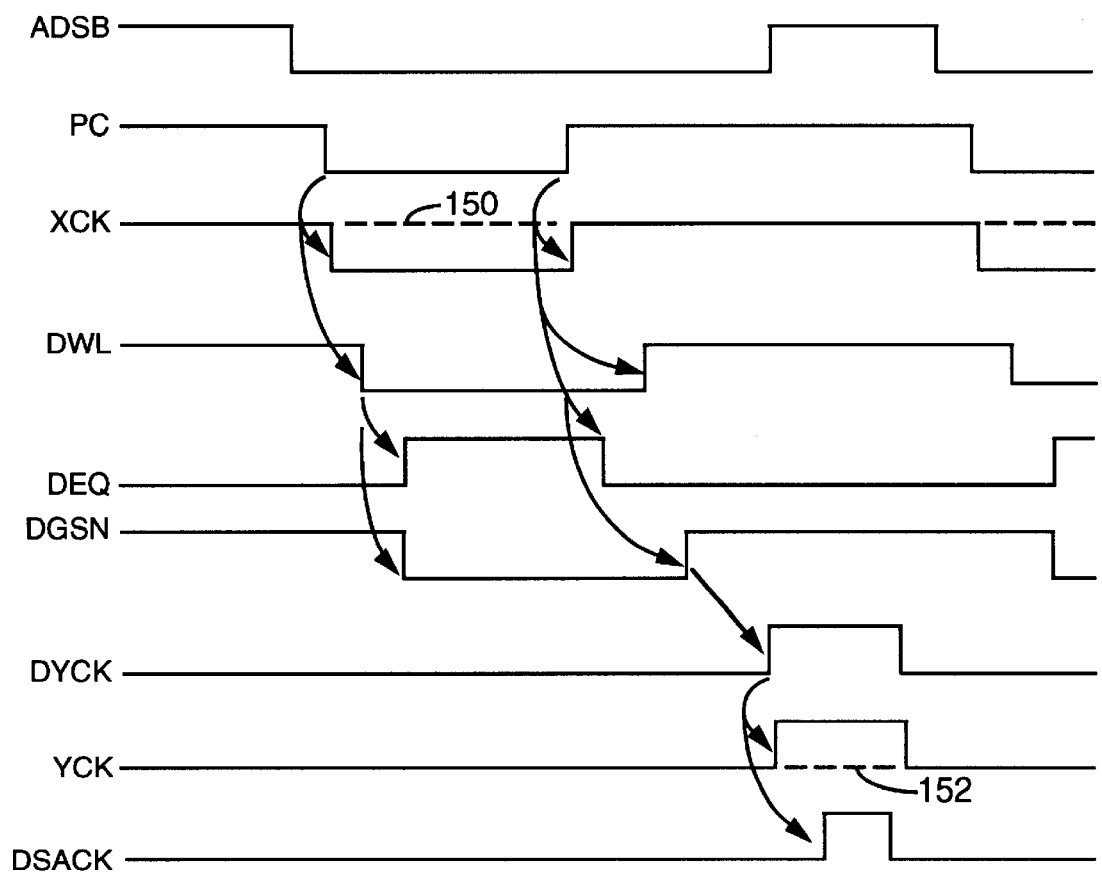
FIG. 5 shows a timing diagram of the memory system of FIG. 1 as controlled by the timing control circuit, where the horizontal axis is time and the vertical axis is voltage.

FIGS. 4A and 4B are schematic diagrams of one embodiment of the timing control circuitry, including timing control circuit 104 and z-decoder 102, respectively, shown in FIG. 1. FIG. 5 shows a timing diagram of memory system 100 controlled by timing control 104 in accordance with an embodiment of the present invention, where the horizontal axis is time and the vertical axis is voltage. The timing shown in FIG. 5 is used in each mode, i.e., the first, second and third modes, as the basic timing of the memory system 100 regardless of whether the memory system 100 undergoes an actual precharge operation.

The timing control circuit 104 internally generates a dummy precharge cycle using dummy precharge circuits to control the timing of memory system 100. It should be understood that when appropriate, i.e., when a new x-address is asserted, timing control circuit 104 will transmit the proper signals to memory system 100 to execute an actual precharge cycle.

As shown in FIG. 4A, the timing control circuit 104 receives the address strobe signal (ADS), which is an inverted address strobe bar signal (ADSB) as indicated by inverter 251. It should be understood that address strobe bar signal (ADSB) may be inverted in the address strobe circuit 108, activity monitor 102, timing control circuit 104, or any other appropriate location. Timing control circuit 104 produces a precharge signal (PC) that follows the address strobe bar signal (ADSB), as shown in FIG. 5, and that remains low for a period determined by delay circuit 252, e.g., approximately 10 ns. The timing control circuit 104 produces an X clock signal (XCK) that is received by the x-decoder 116 (shown in FIG. 1) based on the precharge signal (PC) and the x clock enable signal (XCKEN) produced by the x-address activity monitor 200 (shown in FIG. 3A). If a change in the x-address was detected, i.e., the x clock enable signal (XCKEN) is high, the X clock signal (XCK) received by x-decoder 116 will follow the precharge signal (PC), i.e., transitioning low as shown in FIG. 5, which will disable x-decoder 116 during the precharge period. If, on the other hand, no change in the x-address was detected, i.e., the x clock enable signal (XCKEN) is low, the X clock signal (XCK) received by x-decoder 116 will remain high as indicated with broke line 150.

The precharge signal (PC) also controls a dummy word line (DWL), which follows the precharge signal (PC) by a period determined by delay circuit 254, e.g., 4 ns. As shown in FIG. 5, a dummy equalization signal (DEQ) and a dummy sense latch enable signal (DGSN) follow the dummy word line (DWL), such that when the dummy word line (DWL) goes low, the dummy equalization signal (DEQ) goes high and the dummy sense latch enable signal (DGSN) goes low after a delay caused by delay circuit 256, e.g., 3 ns.

At the end of the precharge cycle, i.e., when precharge signal (PC) transitions high, the dummy equalization signal (DEQ) transitions low, the dummy word line signal (DWL) transitions high after a delay determined by delay circuit 254, and the dummy sense latch enable signal (DGSN) will transition high after a delay determined by delay circuit 254 and delay circuit 256.

If x clock enable (XCKEN) is high, i.e., a change in the x-address was detected, timing control circuit 104 will produce an equalization signal (EQ) that follows the dummy equalization signal (DEQ) and a sense latch enable signal (GSN) that follows the dummy sense latch enable signal (DGSN), both of which are received by sense amplifier 122, shown in FIG. 1. If x clock enable (XCKEN) is low, i.e., no change in the x-address was detected, the equalization signal (EQ) will remain low, thereby disabling the equalization circuit, and the sense latch enable signal (GSN) will remain high so that the sense amplifier 122 remains enabled.

As shown in FIG. 5, the leading edge of the rising dummy sense latch enable signal (DGSN) causes the dummy y clock signal (DYCK) to rise after a delay caused by a delay circuit 258, e.g., 1 ns, shown in FIG. 4A. The dummy y clock signal (DYCK) remains high for a period determined by delay circuit 260, e.g., 4 ns. In addition, a dummy sense amplifier clock signal (DSACK) is triggered by the rising edge of the dummy y clock (DYCK) as shown in FIG. 5. The dummy sense amplifier clock signal (DSACK) follows the dummy y clock signal (DYCK) after the delay from delay circuit 262, e.g., 2 ns, and remains high for a period determined by delay circuit 264, e.g., 2 ns. The dummy sense amplifier clock signal (DSACK) is received by and controls z-decoder 120, as shown in FIG. 1.

The y-decoder 118, shown in FIG. 1, is enabled when there is a change in the y-address and/or the x-address or memory system 100 is to perform a write operation, i.e., the write enable bit (WEB) shown in FIG. 4A is low. As shown in FIG. 4A, a WRITE signal, which is the inverted write enable bit (WEB) and a WRITEB signal, which is a non-inverted write enable bit (WEB) are produced, as shown in FIG. 4A. The WRITE signal and the y clock enable signal (YCKEN) are received by OR gate 266. The output signal from OR gate 266 and the dummy y clock enable signal (DYCK) are received by an AND gate 268. Thus, if either the y clock enable signal (YCKEN), indicating that there is a change in the y-address and/or x-address, or the WRITE signal is high, indicating that there is a write operation, timing control circuit 104 will produce a y clock signal (YCK) that follows the dummy y clock signal (DYCK). Y-decoder 118 is enabled when y clock signal (YCK) is high. If, on the other hand, neither the y clock enable signal (YCKEN) nor the WRITE signal are high, timing control circuit 104 will produce low y clock signal (YCK), shown as broken line 152, and thus, y-decoder 118 will remain disabled.

Timing control circuit 104 produces a sense amplifier clock signal (SACK) that is received by the second sense amplifier 126, shown in FIG. 1. The sense amplifier clock signal (SACK) follows the dummy sense amplifier clock signal (DSACK) when the y clock enable signal (YCKEN) is high and the WRITE signal is low, indicating that there is a read operation. If either the dummy sense amplifier clock signal (DSACK) is low or the WRITE signal is high, indicating that there is a write operation, the sense amplifier clock signal (SACK) is low, which disables sense amplifier 126.

FIG. 4B shows a schematic diagram of circuitry in z-decoder 120 that is used to control the timing of the operation of z-select circuit 128. As shown in FIG. 4B, z-decoder 120 receives the four bit z address ZADD[0:3] and using a conventional decoder 160 produces a sixteen addresses ZD[0:15]. For a read operation, the z-decoder 120 uses the dummy sense amplifier clock signal (DSACK) to latch each address ZD[0:15] into latching circuits 162, which include NOR gates 163 that also receive the WRITE signal. It should be understood that only one latching circuit 162 is shown for the sake of clarity. The latching circuits 162 produce read addresses ZR[0:15] to z-select 128. For a write operation, the z-decoder 120 uses the WRITE signal to latch each address ZD[0:15] into different latching circuits 164, which include NOR gates 165 that also receive the WRITEB signal. It should be understood that only one latching circuit 164 is shown for the sake of clarity. The latching circuits 164 produce the write addresses ZW[0:15] to z-select 128.

It should be understood that while FIGS. 3A, 3B, 4A, and 4B show specific circuitry that may be used in accordance with the present invention, the particular illustrated logic gates represent the functionality of the activity monitoring circuitry and timing circuitry, and are not limiting. Many alternative means of accomplishing the desired functions will be readily apparent to those of skill in the art. Moreover, the particular circuitry shown, including logic gates, delay circuits and decoders may be conventional and are well understood by those of ordinary skill in the art. For example, the delay circuits may be conventional RC delay circuits or any other appropriate circuit.

Figure 6:
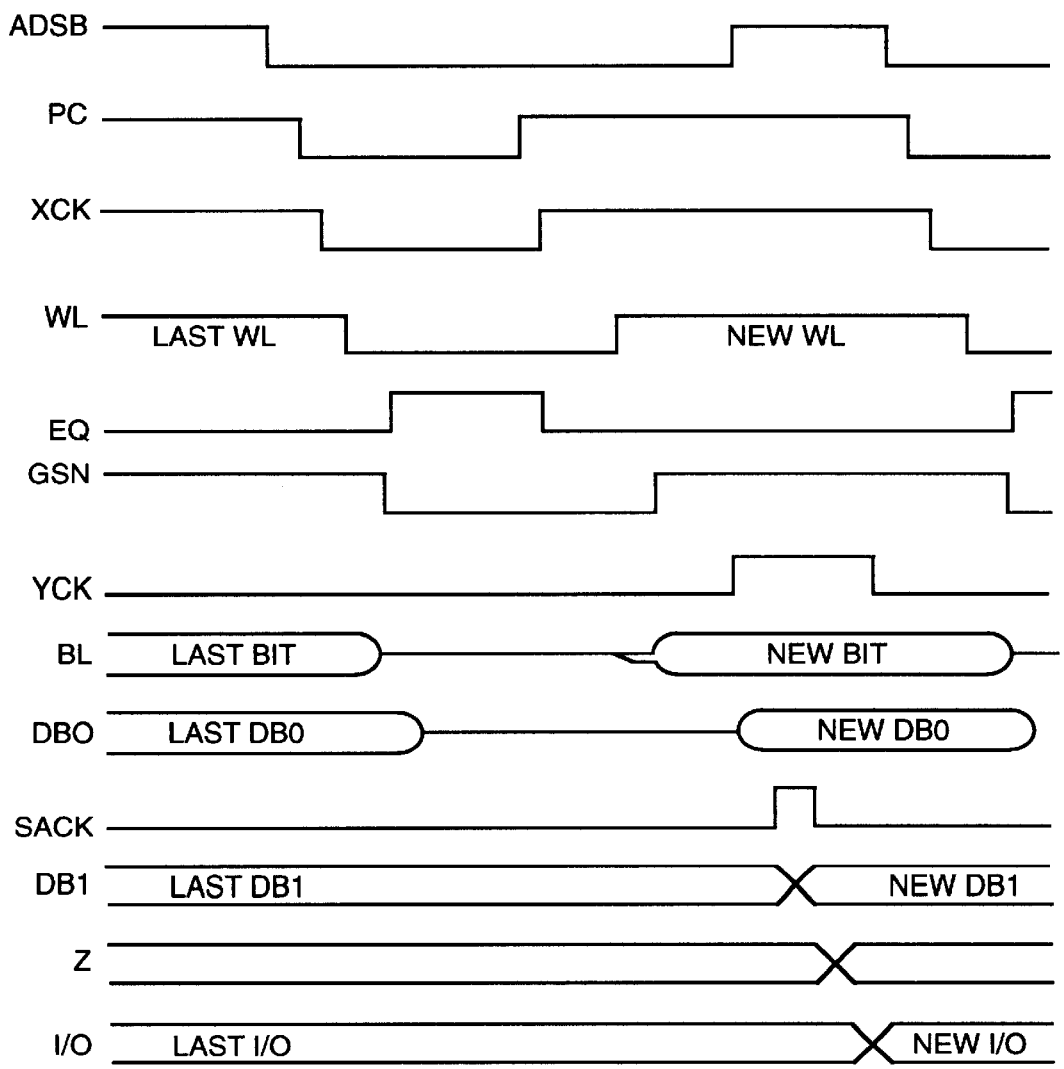
FIGS. 6 through 8 show timing diagrams of the operation of three different modes of the memory system in accordance with an embodiment of the present invention, where the horizontal axis is time and the vertical axis is voltage.
Figure 7:
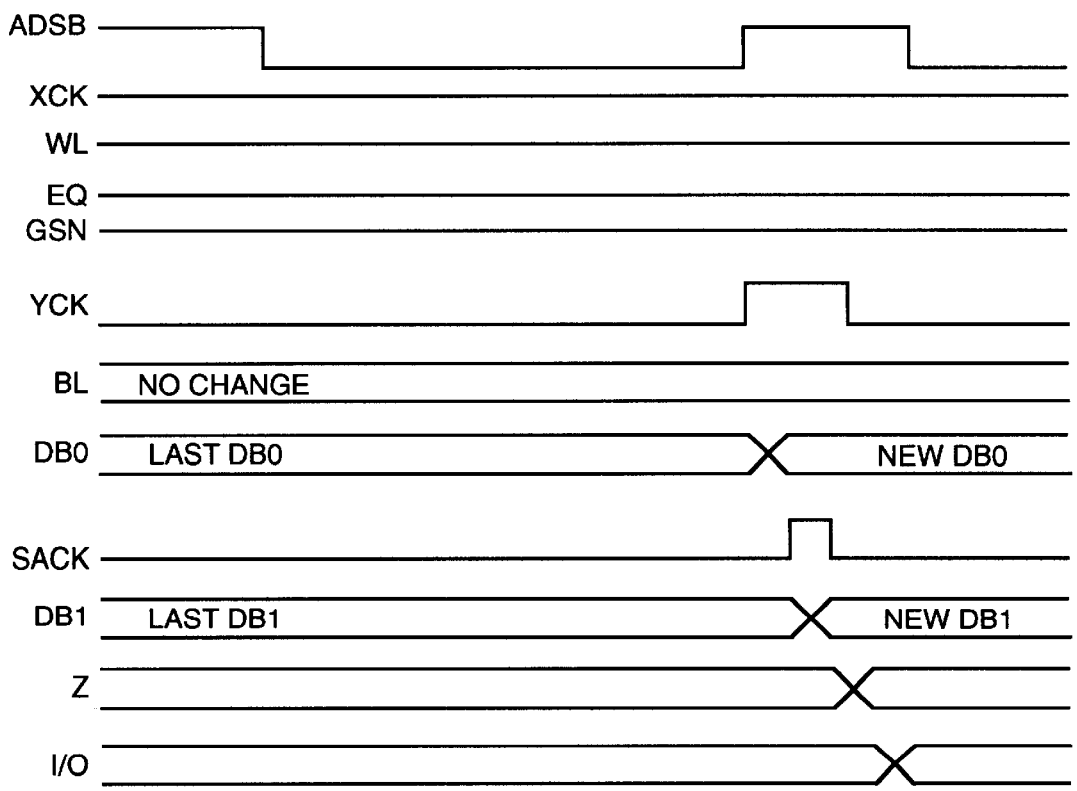
Figure 8:
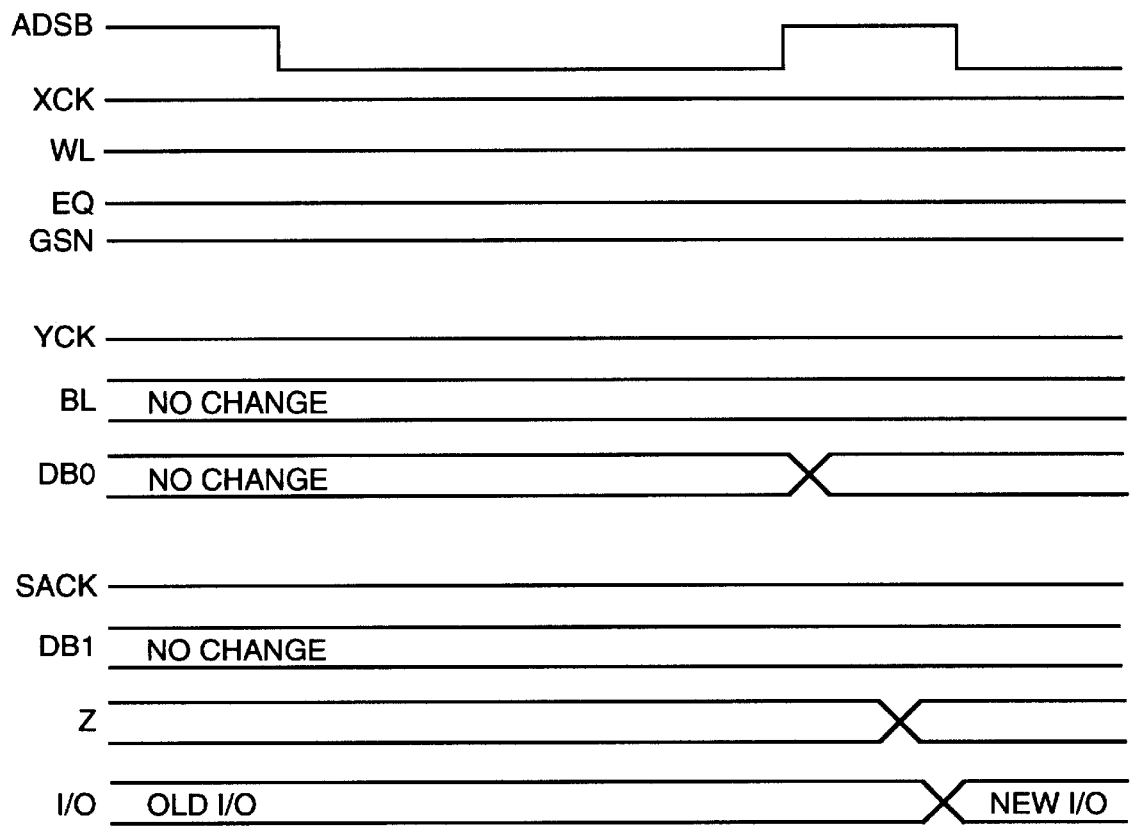

FIGS. 6 through 8 show timing diagrams of the operation of the memory system 100 in accordance with an embodiment of the present invention, where the horizontal axis is time and the vertical axis is voltage.

FIG. 6 shows a timing diagram of the operation of the memory system 100 when there is a change in the x-address, i.e., during mode 1. As described above, because there is a change in the x-address, a precharge operation is performed prior to the active cycle of the memory device. Thus, the new x-address is latched and detected at the transition of address strobe bar signal (ADSB) and the precharge cycle is initiated, i.e., precharge signal (PC) goes low. As described above, the x clock signal (XCK) follows the precharge signal (PC) and disables the x-decoder 116, illustrated by word line (WL) going low. The equalization signal (EQ) transitions high and the sense latch enable signal (GSN) transitions low to equalize BIT and BITX at sense amplifier 122 shown in FIG. 1. After a predetermined amount of time, e.g., approximately 10 ns, the precharge signal (PC) goes high followed by the equalization signal (EQ) being disabled and the x clock signal (XCK) going high. The new word line is produced, shown by word line signal (WL), for the new address. The sense latch enable signal (GSN) at sense amplifier 122 then goes high. Thus, the 2K BIT/BITX signals are amplified and latched at sense amplifier 122, which at the same time writes back the read information to the memory array 106 in a conventional manner and splits the new BIT/BITX signals, as indicated by signal (BL). Because a new x-address was asserted, a new y-address is also asserted. Thus, the y clock (YCK), which follows the dummy y clock signal (DYCK) as described above, transitions high to select the data output (DBO). The secondary sense amplifier clock signal (SACK) follows the dummy sense amplifier clock signal (DSACK) as described above, and is received by sense amplifier 126, which latches the new data (DB1). As described above in reference to FIG. 4B, the z-decoder 120 produces a read select signal ZR[0] to ZR[15] to z-select 128 which selects the appropriate bits for the I/O circuits 130.

FIG. 7 shows a timing diagram of the operation of the memory system 100 when there is no change in the x-address, but there is a change in the y-address, i.e., during mode 2. As described above, because the same x-address (word line) is used, there is no precharge cycle. Thus, as shown in FIG. 7, the x clock signal (XCK) remains high, and thus, the same word line signal (WL) is used. Because there is no precharge cycle, the equalization signal (EQ) remains low and the sense latch enable signal (GSN) remains high. Accordingly, the same 2K BIT/BITX signals shown as signal (BIT) are amplified and latched at sense amplifier 122. Based on the rising edge of the dummy sense latch enable signal (DGSN) in timing control 104, as described in reference to FIG. 4A, the timing control 104 causes the y clock signal (YCK) to go high to select the data output (DBO). The rising edge of the bit line (Y) causes the secondary sense amplifier clock signal (SACK) to pulse, which is received by sense amplifier 126 which latches the new data (DB1). As described above in reference to FIG. 4B, the z-decoder 120 produces a read select signal ZR[0] to ZR[15] to z-select 128 which selects the appropriate bits for the I/O circuits 130.

FIG. 8 shows a timing diagram of the operation of the memory system 100 when there is no change in the x-address or the y-address, but there is a change in the z-address, i.e., during mode 3. Because the same x-address (word line) is used, there is no precharge cycle. Moreover, because the same y-address is used the y clock signal (YCK) does not change, nor does the data output (DBO). Moreover, a sense amplifier clock pulse (SACK) is unnecessary because the sense amplifier has already latched the data. Thus, as shown in FIG. 8, in mode 3, the z-decoder 120 produces a read select signal ZR[0] to ZR[15] to z-select 128 which selects the appropriate bits for the I/O circuits 130.

Thus, as shown in FIGS. 7 and 8, when there is no change in the x-address, the precharge cycle is not performed, which advantageously provides significant power savings. For example, in the embodiment shown in FIG. 1, the z-address will change 16 times before the y-address changes, and the y-address will change 8 times before the x-address changes. Thus, the x-address changes once in 128 cycles and, thus, a precharge operation is performed only once in 128 cycles. The average power consumed in accordance with the present invention is as follows:

$$\text{Ave.Power} = (1/128)(\text{Pwr Mode 1}) + (1/8)(\text{Pwr Mode 2}) + (\text{Pwr Mode 3}) \quad \text{Equ. 1}$$

where Pwr Mode 1, Pwr Mode 2, Pwr Mode 3 is the power consumed in modes 1, 2, and 3, respectively. The power consumed in mode 1, i.e., when a new word line is asserted and there is a precharge cycle is approximately 14 mA. The power consumed in modes 2 and 3, with no precharge cycle, are approximately 8 mA and 0.4 mA, respectively. Thus, the average power consumed by the memory system 100 according to equation 1 is approximately 1.01 mA, whereas the average power consumed by a conventional memory system is approximately 22 mA.

Although the present invention has been described in considerable detail with reference to certain versions thereof, other versions are possible. Some components are shown directly connected to one another while others are shown connected via intermediate components. In each instance, the method of interconnection establishes some desired electrical communication between two or more circuit nodes. Such communication as well as the logic functions of the circuits may often be accomplished using a number of circuit configurations, as will be understood by those of ordinary skill in the art. Therefore, the spirit and scope of the appended claims should not be limited to the description of the versions depicted in the figures.

What is claimed is:

1. A method of operating a DRAM array having a plurality of memory cells arranged in rows with associated x-addresses and columns with associated y-addresses, sense amplifiers associated with the rows and columns, said DRAM array coupled to a non-multiplexed address input interface, said method comprising:

receiving a first non-multiplexed address, comprising at least an x-address and a y-address;

receiving a second address, comprising at least a new x-address and a new y-address;

determining if said new x-address in said second address is different than said x-address in said first address; and precharging said DRAM array if said new x-address in said second address is different than said x-address in said first address and not precharging said DRAM array if said new x-address in said second address is not different than said x-address in said first address.

2. The method of claim 1, further comprising accessing said DRAM array according to said second address after said determining if said new x-address in said second address is different than said x-address in said first address and precharging said DRAM array if said new x-address in said second address is different than said x-address in said first address.

3. The method of claim 2, further comprising generating a dummy precharge timing cycle wherein said accessing said DRAM array is performed after said dummy precharge timing cycle.

4. The method of claim 3, wherein said precharging said DRAM array is performed according to the timing of said dummy precharge timing cycle.

5. The method of claim 1, further comprising
determining if said new y-address in said second address is different than said y-address in said first address; and
disabling the sense amplifier associated with said columns if said new y-address in said second address is the same as said y-address in said first address.

6. A method of operating a memory system, including a DRAM array with word lines and bit lines and associated sense amplifiers and that is in a non-multiplexed address interface, said method of operating comprising:

receiving a new address for said DRAM array;

performing a precharge cycle to precharge said DRAM array when said new address includes a new word line; and performing an active cycle to access said DRAM array after said precharge cycle.

7. The method of claim 6, further comprising:

performing a dummy precharge cycle that does not precharge said DRAM array when said new address does not include a new word line; and performing an active cycle to access said DRAM array after said dummy precharge cycle.

8. The method of claim 6, further comprising:

performing a dummy precharge cycle that does not precharge said DRAM array when said new address includes a new word line; and performing said precharge cycle based on the timing of said dummy precharge cycle.

9. The method of claim 6, further comprising disabling the bit line sense amplifier when said new address includes the same bit line address as in a preceding address.

10. A control circuit for controlling the operation of a DRAM array having a plurality of rows and columns of memory cells, sense amplifiers associated with the memory cells, and word lines, bit lines, column switches, and bit equalization lines associated with the memory cells, the control circuit comprising:

an input terminal for receiving an x-address associated with said word lines for a new operation cycle;

a comparison circuit coupled to said input terminal, said comparison circuit determines if said x-address is different from a preceding x-address for a preceding operation cycle;

a timing generator coupled to said comparison circuit, said timing generator outputs an equalization enable signal and a sense latch disable signal when said x-address is different from said preceding x-address and outputs an equalization disable signal and a sense latch enable signal when said x-address is the same as said preceding x-address.

11. The control circuit of claim 10, wherein said timing generator further outputs an x-decoder disable signal when said x-address is different from said preceding x-address.

12. The control circuit of claim 10, wherein said timing generator receives a chip select signal, said timing generator including delay circuits that delay said chip select signal to generate a dummy precharge cycle including at least a dummy equalization enable signal and a dummy sense latch disable signal.

13. The control circuit of claim 12, wherein said equalization enable signal and said sense latch disable signal have the same timing as said dummy equalization enable signal and said dummy sense latch disable signal, respectively.

14. The control circuit of claim 12, wherein said timing generator outputs a secondary sense latch enable signal after a predetermined delay after the end of said dummy precharge cycle.

15. The control circuit of claim 12, further comprising:
   a second input terminal for receiving a y-address associated with said bit lines for a new operation cycle;
   said comparison circuit determines if said y-address is different from a preceding y-address for said preceding operation cycle; and
   wherein said timing generator outputs a secondary sense latch disable signal when said y-address is the same as said preceding y-address for said preceding operation cycle.

16. A memory system including a DRAM array coupled to an SRAM interface, said memory system comprising:
   an activity monitor circuit that receives an x-address associated with a word line for a new operation cycle of said DRAM array, said activity monitor circuit having a comparison circuit that compares said x-address with an old x-address for a preceding operation cycle of said DRAM array and having an output terminal that outputs a signal indicating when said x-address is the same as said old x-address; and
   a timing control circuit having an input terminal that receives said signal indicating when said x-address is the same as said old x-address, said timing control circuit having a timing element that simulates a precharge cycle, said timing control circuit having an output terminal that outputs a sense latch enable signal after said simulated precharge cycle.

17. The memory system of claim 16, wherein:
   said activity monitor circuit outputs on said output terminal a signal indicating when said x-address is different than said old x-address; and
   said timing control circuit activates an actual precharge cycle by outputting an equalization enable signal and a sense latch disable signal when said when said x-address is different than said old x-address, said timing control circuit outputs a sense latch enable signal after said actual precharge cycle.

* * * * *